United States Patent
Pang

(10) Patent No.: US 8,624,655 B2
(45) Date of Patent: Jan. 7, 2014

(54) LEVEL SHIFTER CIRCUIT AND GATE DRIVER CIRCUIT INCLUDING THE SAME

(75) Inventor: Sung Man Pang, Gyunggi-do (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 0 days.

(21) Appl. No.: 13/564,253

(22) Filed: Aug. 1, 2012

(65) Prior Publication Data
US 2013/0320956 A1  Dec. 5, 2013

(30) Foreign Application Priority Data

May 31, 2012 (KR) .................. 10-2012-0058072

(51) Int. Cl.
*H03L 5/00*  (2006.01)
(52) U.S. Cl.
USPC .................................................... 327/333
(58) Field of Classification Search
USPC ............ 327/333; 365/189.11; 326/68, 80, 81
See application file for complete search history.

(56) References Cited

U.S. PATENT DOCUMENTS

| | | |
|---|---|---|
| 5,552,731 A | 9/1996 | Diazzi et al. |
| 6,326,831 B1 | 12/2001 | Kumagai |
| 6,369,612 B1 * | 4/2002 | Shokouhi ..................... 326/68 |
| 7,548,029 B2 * | 6/2009 | Cheng et al. ................. 315/291 |
| 2006/0049859 A1 | 3/2006 | Hwang et al. |
| 2010/0219874 A1 | 9/2010 | Honda |
| 2012/0229165 A1 * | 9/2012 | Tseng et al. ..................... 326/82 |

FOREIGN PATENT DOCUMENTS

| | | |
|---|---|---|
| JP | 2010-226703 A | 10/2010 |
| KR | 20040080343 A | 9/2004 |
| KR | 10-2006-0005515 A | 1/2006 |
| KR | 10-1083093 | 11/2011 |
| WO | 03055072 A1 | 7/2003 |

OTHER PUBLICATIONS

Korean Office Action with English Translation issued in Korean Patent Application No. 10-2012-0058072 dated Jun. 27, 2013.

* cited by examiner

*Primary Examiner* — Lincoln Donovan
*Assistant Examiner* — Sibin Chen
(74) *Attorney, Agent, or Firm* — McDermott Will & Emery LLP

(57) ABSTRACT

There are provided a level shifter circuit and a gate driver circuit including the same. The level shifter circuit includes: a plurality of switching devices connected to a predetermined DC power supply through a resistor and operated by different driving signals; a gain conversion unit operated by first signals output from the plurality of switching devices, respectively, and generating second signals having a level within a predetermined range of the first signals; and a noise removal unit connected to at least one output terminal among the plurality of switching devices to prevent malfunctioning of the gain conversion unit, wherein the gain conversion unit inputs the second signals to a high side gate driver circuit through an inverter circuit.

14 Claims, 5 Drawing Sheets

LEVEL SHIFTER CIRCUIT AND GATE DRIVER CIRCUIT INCLUDING THE SAME

CROSS-REFERENCE TO RELATED APPLICATIONS

This application claims the priority of Korean Patent Application No. 10-2012-0058072 filed on May 31, 2012, in the Korean Intellectual Property Office, the disclosure of which is incorporated herein by reference.

BACKGROUND OF THE INVENTION

1. Field of the Invention

The present invention relates to a level shifter circuit capable of preventing malfunctions from occurring due to sudden voltage fluctuations while being stably operated even when a range of an operating voltage has a negative potential, and a gate driver circuit including the same.

2. Description of the Related Art

A level shifter circuit is a circuit shifting an on/off signal that is a control signal having a low voltage level to have a high or low voltage level in a high side gate driver circuit. In order to drive a switching device such as a high side insulated gate bipolar transistor (IGBT) or a metal-oxide-semiconductor field-effect transistor (MOSFET), a relatively inexpensive pulse transformer having a simple structure has mainly been used in the related art. However, the pulse transformer has a low operating speed and thus, a level shifter circuit has mainly been used for a high side gate driver circuit. Generally, the level shifter circuit includes a common source of which the load resistor is connected to an output terminal of the switching device (generally, a transistor).

A general level shifter circuit used for the high side gate driver circuit receives a pulse signal having different phases as an input signal and shifts a level of the received pulse signal to generate an output signal. The output signal is applied to an input terminal of an inverter of the high side gate driver circuit. In this case, malfunctions may occur in the high side gate driver circuit when the level of the output signal is only changed to a ground level, in the case in which a level of the output signal applied to the input terminal of the inverter drops to have a negative (−) potential from a potential of a reference voltage of the high side gate driver circuit.

In the following related art documents, Patent Document 1 relates to a level shifter circuit applied to a high side gate driver circuit and discloses contents in which a VIV shifter changes a level range of a signal applied to an input terminal of an inverter of a high side gate driver circuit, but does not disclose a level shifter circuit having a simple structure using a current mirror circuit as in the present invention. In addition, Patent Document 2 discloses contents in which a malfunction due to a sudden fluctuation in voltage (dv/dt) is prevented, but does not disclose contents in which a malfunction occurring when a reference voltage of a high side gate driver circuit drops to have a negative (−) potential is prevented.

RELATED ART DOCUMENTS (Patent Document 1) Korean Patent No. 10-1083093-0000
(Patent Document 2) Korean Patent Laid-Open Publication No. 10-2006-0005515

SUMMARY OF THE INVENTION

An aspect of the present invention provides a level shifter circuit including a gain conversion unit including a current mirror circuit able to operate stably even when reference voltage of high side gate driver circuit drops to have a negative (−) potential, and a noise removal unit capable of preventing malfunctioning of the gain conversion unit when a sudden fluctuation in voltage occurs.

According to an aspect of the present invention, there is provided a level shifter circuit including: a plurality of switching devices connected to a predetermined DC power supply through a resistor and operated by different driving signals; a gain conversion unit operated by first signals output from the plurality of switching devices, respectively, and generating second signals having a level within a predetermined range of the first signals; and a noise removal unit connected to at least one output terminal among the plurality of switching devices to prevent malfunctioning of the gain conversion unit, wherein the gain conversion unit inputs the second signals to a high side gate driver circuit through an inverter circuit.

The plurality of switching devices may include a first switching device and a second switching device that are operated by different driving signals to generate different output signals, the gain conversion unit may include a third switching device connected to an output terminal of the first switching device, and the noise removal unit may include a fourth switching device connected to an output terminal of the second switching device.

The gain conversion unit may include a current mirror circuit that is controlled by a turning-on and turning-off operation of the third switching device.

The current mirror circuit may have a current mirror ratio set so that current flowing in the fourth switching device is higher than that flowing in an output terminal of the current mirror circuit.

The gain conversion unit may generate the second signal having a signal level in a range different from the first signal.

The level shifter circuit may further include: a filter circuit connected between an output terminal of the gain conversion unit and an input terminal of the inverter to filter a signal having a pulse width smaller than that of the driving signal.

The plurality of switching devices, the gain conversion unit, and the noise removal unit may be included in a single integrated circuit (IC).

According to another aspect of the present invention, there is provided a level shifter circuit including: a first transistor and a second transistor controlled so as to be turned-on and turned-off by a first pulse signal and a second pulse signal having different phases; a first resistor and a second resistor respectively connected between drain terminals of the first transistor and the second transistor and a predetermined DC power supply; a third transistor connected to the drain terminal of the first transistor; a fourth transistor connected to the drain terminal of the second transistor; and a first current mirror circuit having an input terminal connected to a drain terminal of the third transistor and an output terminal connected to a drain terminal of the fourth transistor, wherein the fourth transistor prevents output fluctuations in the first current mirror circuit due to a voltage drop occurring in at least one of the first resistor and the second resistor by a change in the DC power supply.

The level shifter circuit may further include: a fifth transistor connected to the drain terminal of the second transistor; a sixth transistor connected to the drain terminal of the first transistor; and a second current mirror circuit having an input terminal connected to a drain terminal of the fifth transistor and an output terminal connected to a drain terminal of the sixth transistor, wherein the sixth transistor prevents output fluctuations in the second current mirror circuit due to a voltage drop occurring in at least one of the first resistor and the second resistor due to the change in the DC power supply.

The first current mirror circuit may generate a first output signal by processing the first pulse signal as an input signal, and the second current mirror circuit may generate a second output signal by processing the second pulse signal as an input signal.

The level shifter circuit may further include: an inverter circuit connected to the output terminal of the first current mirror circuit to transfer an output signal of the current mirror circuit to a high side logic circuit.

The level shifter circuit may further include: a filter circuit connected to the output terminal of the first current mirror circuit to filter noise due to a pulse signal having a width smaller than a pulse width of the first pulse signal and the second pulse signal.

The first current mirror circuit may have a current mirror ratio set so that current flowing in the fourth transistor is higher than that flowing in the output terminal of the first current mirror circuit.

The first to fourth transistors, the first and second resistors, and the first current mirror circuit may be included in a single integrated circuit (IC).

According to another aspect of the present invention, there is provided a gate driver circuit including the level shifter circuit as described above.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
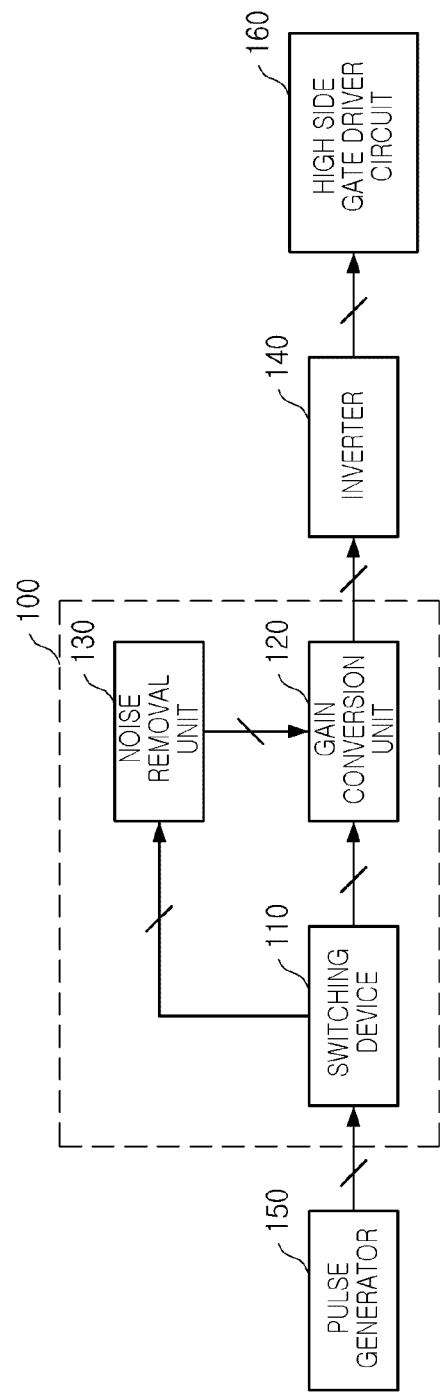
FIG. 1 is a block diagram illustrating a level shifter circuit according to an embodiment of the present invention.

Embodiments of the present invention will be described in detail with reference to the accompanying drawings. These embodiments will be described in detail to allow those skilled in the art to practice the present invention. It should be appreciated that various embodiments of the present invention are different but are not necessarily exclusive. For example, specific shapes, configurations, and characteristics described in an embodiment of the present invention may be implemented in another embodiment without departing from the spirit and the scope of the present invention. In addition, it should be understood that positions and arrangements of individual components in each disclosed embodiment may be changed without departing from the spirit and the scope of the present invention. Therefore, the detailed description described below should not be construed as being restrictive. In addition, the scope of the present invention is defined only by the accompanying claims and their equivalents if appropriate. Similar reference numerals will be used to describe the same or similar functions throughout the accompanying drawings.

Hereinafter, embodiments of the present invention will be described in detail with reference to the accompanying drawings so that those skilled in the art may easily practice the present invention.

FIG. 1 is a block diagram illustrating a level shifter circuit according to an embodiment of the present invention.

Referring to FIG. 1, a level shifter circuit 100 according to an embodiment of the present invention may include a plurality of switching devices 110, a gain conversion unit 120, and a noise removal unit 130. The plurality of switching devices 110 are connected to a pulse generator 150, and an output of the noise removal unit 130 may be connected to a high side gate driver circuit 160 through an inverter 140.

The pulse generator 150 generates one or more pulse signals having different phases. The pulse signals generated by the pulse generator 150 may be applied to the plurality of switching devices 110, respectively, to control turning-on and turning-off of each switching device. The plurality of switching devices 110 are each connected to a node having a predetermined voltage and the pulse signal applied in the low voltage area by the turning-on and turning-off of the plurality of switching devices 110, respectively, is shifted into the first signal of the high voltage area, which is in turn transferred.

The gain conversion unit 120 is operated by being provided with a plurality of first signals output from the plurality of switching devices 110, respectively. The gain conversion unit 120 may generate a plurality of second signals having a voltage level in a range different from the plurality of first signals. The gain conversion unit 120 is disposed between the plurality of switching devices 110 and an inverter 140, thereby securing stable operations even when a reference voltage VS drops to have a negative (−) potential. A detailed operation of the gain conversion unit 120 will be described below.

The noise removal unit 130 receives at least a part of the plurality of first signals generated by the plurality of switching devices 110 and prevents the malfunctioning of the gain conversion unit 120. When the sudden change (dv/dt) in voltage occurs at a node connected to the plurality of switching devices 110 through a resistor, a voltage drop may occur so as to charge parasitic capacitance present in the plurality of switching devices 110, respectively, such that the malfunction may occur. The noise removal unit 130 prevents the malfunctioning and the detailed operation of the noise removal unit 130 will be described below similar to the gain conversion unit 120.

The second signals output from the gain conversion unit 120 are input to the high side gate driver circuit 160 via the inverter 140. For example, the signal passing through the inverter 140 may be input to an S-R latch of the high side gate driver circuit 160, and an output signal of the S-R latch may be input to the gate driver to drive a gate of a high voltage output device connected to an output terminal of the gate driver.

Figure 2:
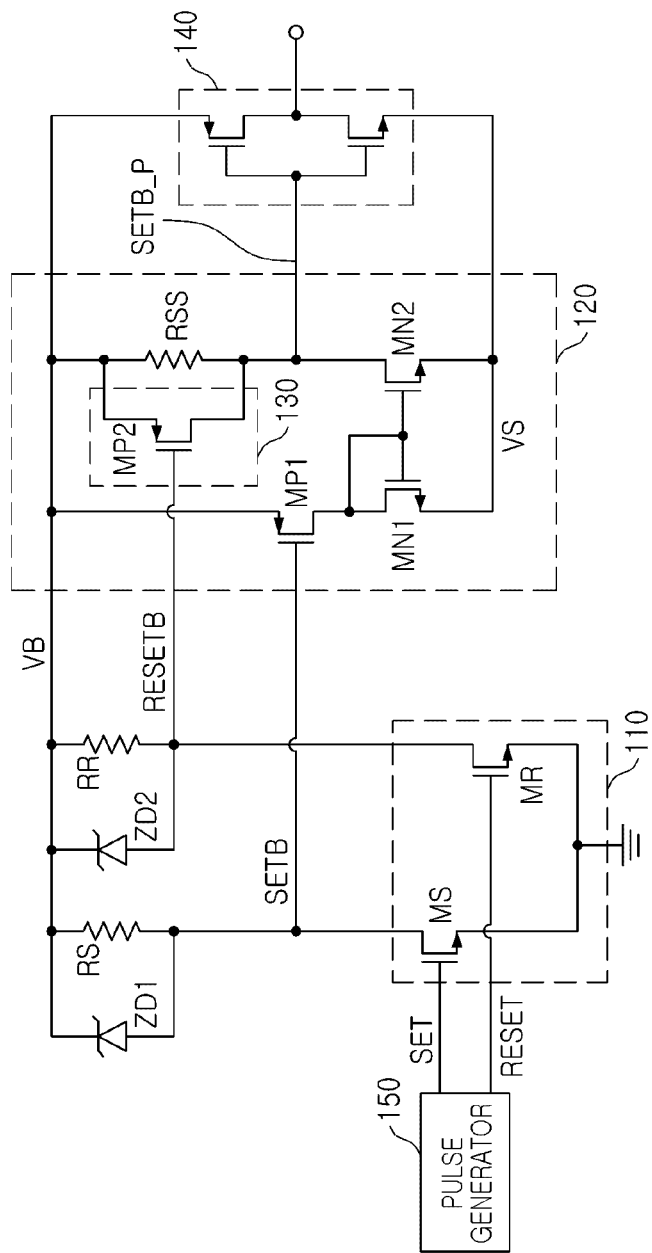
FIGS. 2 and 3 are circuit diagrams illustrating the level shifter circuit according to the embodiment of the present invention.
Figure 3:
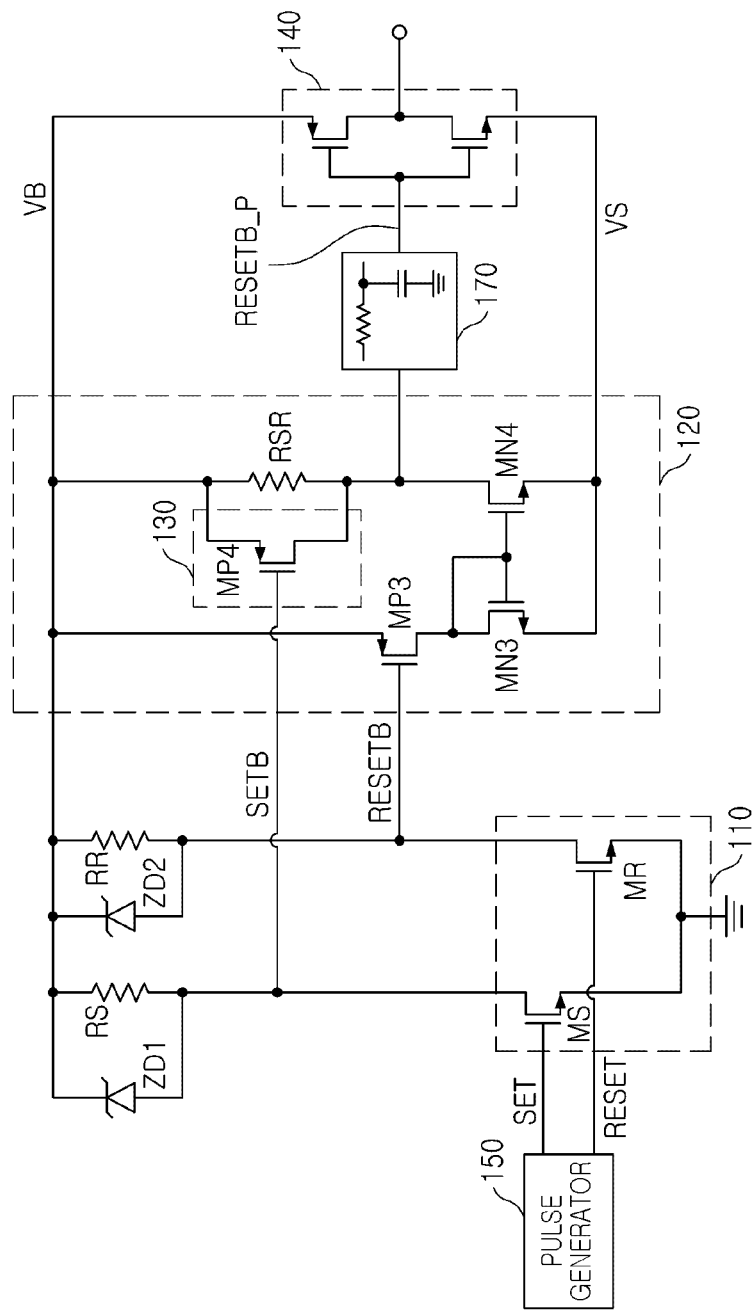

FIGS. 2 and 3 are circuit diagrams illustrating a level shifter circuit according to an embodiment of the present invention.

Referring first to FIG. 2, two signals SET and RESET output from the pulse generator 150 are input to the plurality of switching devices 110, respectively. In an embodiment of the present invention, the plurality of switching devices 110 may include transistors MS and MR. In this case, the signal SET may be input to a gate terminal of the transistor MS and the signal RESET may be input to a gate terminal of the transistor MR. The signal SET and the signal RESET have different phases and therefore, the transistor MS and the transistor MR also have different turn-on timings.

Drain terminals of the transistor MS and the transistor MR are respectively connected to voltage (VB) via a resistor RS and a resistor RR. For example, when the transistor MS is turned-on, voltage is generated at one end of the resistor RS by the voltage VB. The voltage generated at one end of the resistor RS is a signal SETB, which is input to a gate terminal of a transistor MP1 of the gain conversion unit 120.

The transistor MP1 of the gain conversion unit 120 includes a source terminal connected to the voltage VB, a gate terminal receiving the signal SETB, and a drain terminal connected to a drain terminal of a transistor MN1. The transistor MN1 is driven according to an operation of the transistor MP1, and the transistor MN1 configures a current mirror circuit together with a transistor MN2. Hereinafter, a detailed operation of the circuit shown in FIG. 2 will be described below.

When the signal SET is high and is applied to the gate terminal of the transistor MS, the voltage drop occurs in the resistor RS connected to the drain terminal of the transistor MS and the transistor MP1 is operated due to the voltage drop occurring in the resistor RS. As the transistor MP1 is turned-on, the transistor MN1 and the transistor MN2 are operated as the current mirror circuit and a signal SETB_P is output from a drain terminal of the transistor MN2 that is pulled-up to a resistor RSS. In this case, voltage of a SETB_P drops below a threshold voltage VTH of the high side gate driver circuit including the inverter 140 and as a result, the signal SET is recovered, such that the high side gate driver circuit may be normally operated.

In this case, a voltage drop VRS occurring by the resistor RS is shifted to a voltage drop VRSS across the resistor RSS according to the following Equation 1. In Equation 1, Gm represents trans-conductance of the transistor MP1 and m represents a current mirror ratio determined by the transistor MN1 and the transistor MN2.

$$VRSS = VRS * G_m * mRSS \qquad \text{Equation 1}$$

When a value of the resistor RS increases, noise characteristics against parasitic capacitance component of the transistor MS and the transistor MR is improved but malfunctions may occur in the overall circuit when the value of the reference voltage VS drops to have a negative (−) potential. That is, the overall circuit is normally operated under the condition that the voltage VB is higher than VBS-VTH, and when VS drops to have a negative potential, the threshold voltage VTH of the inverter 140 may also be reduced to a negative potential and thus, the inverter 140 may not be normally operated since it does not cross the potential of the threshold voltage VTH even when the signal SETB is swung between the potential and 0V of the voltage VB. The gain conversion unit 120 shown in FIG. 2 is to resolve the above problems and in the embodiment of the present invention, the signal SETB_P of which the gain is shifted, instead of the signal SETB, is input to the inverter 140.

The signal SETB has a value between the potential of the voltage VB and 0V. On the other hand, the potential of the signal SETB_P has a value between the potential of the voltage VB and the potential of the reference voltage VS. Therefore, even when the potential of the reference voltage VS is reduced to the negative (−) value and thus a potential of threshold voltage VTH of a logic circuit having the inverter 140 also has a negative (−) value, the signal SETB_P is changed within the range in which the potential of the threshold voltage VTH is included and therefore, the logic circuit including the inverter 140 may be normally operated.

Meanwhile, the transistor MP2 connected across the resistor RSS may be operated as the noise removal unit 130. That is, when the potential change (dV/dt) in the voltage VB suddenly occurs, current for charging the parasitic capacitance of the transistor MS and the transistor MR is generated and therefore, the unintended voltage drop occurs between the resistor RS and the resistor RR. The transistor MP2 prevents the malfunctioning of the circuit that occurs from the unintended voltage drop.

In FIG. 2, when the voltage drop appears across the resistor RR due to the sudden change in the potential of the voltage VB, the transistor MP2 is turned-on. Therefore, the voltage drop through the resistor RSS does not occur and the potential of the signal SETB_P may be still maintained in a high state. The in-phase noise may be removed from the above configuration. In this case, the current of the transistor MP2 may be set to be higher than the current of the transistor MN2.

Meanwhile, the circuit shown in FIG. 3 is operated similar to FIG. 2. However, the circuit shown in FIG. 3 is different from the circuit shown in FIG. 2 in that a transistor MP3 included in the gain conversion unit 120 operates the current mirror circuit by a signal RESETB, and the turning-on and turning-off of the transistor MP4 included in the noise removal unit 130 is controlled by the signal SETB.

The circuits shown in FIGS. 2 and 3 may be included in a single level shifter circuit and when the potential of the reference voltage VS is reduced to the negative (−) potential, a malfunction due to both of the signal SETB and the signal RESETB may be prevented. The malfunction appearing due to the sudden change in the potential of the voltage VB may be resolved by including both of the transistor MP2 and the transistor MP4 shown in FIGS. 2 and 3.

Referring to FIG. 3, a filter circuit 170 may be additionally provided between the output terminal of the gain conversion unit 120 and the input terminal of the inverter 140. The filter circuit 170 may filter a noise signal having a pulse width smaller than PW so that the noise signal is not transferred to a logic circuit including the inverter 140 when pulse widths of the signals SET and RESET output from the pulse generator 150 are the PW. The filter circuit 170 shown in FIG. 3 may also be applied to FIG. 2.

Figure 4:
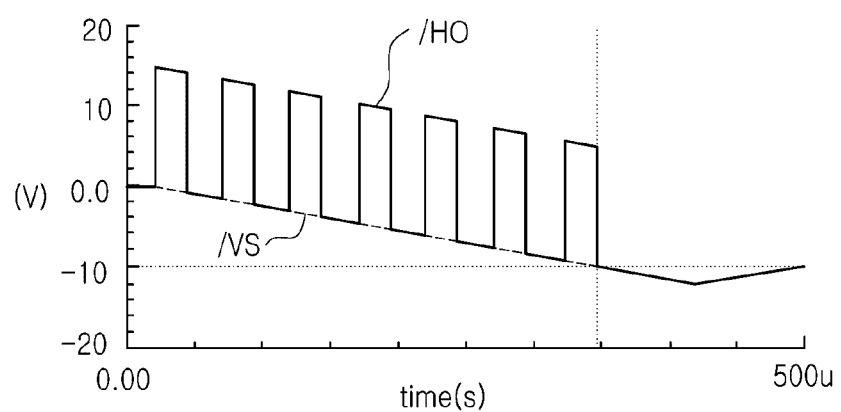
FIG. 4 is a graph for describing an operation of the level shifter circuit according to the embodiment of the present invention.

FIG. 4 is a graph for describing an operation of a level shifter circuit according to the embodiment of the present invention.

Referring to FIG. 4, when the reference voltage VS is changed to the negative (−) potential, an output signal H0 of the high side gate driver circuit is shown. That is, even when the potential of the reference voltage VS is changed to −10.0 V, the output signal H0 of the high side gate driver circuit is normally output and therefore, it is possible to secure a relatively wide normal operating range for the reference voltage VS having the negative (−) potential.

A graph of FIG. 4 shows, in simulation, a result in which the output signal H0 of the high side gate driver circuit is normally output under the assumption that the reference voltage VS is changed to −10.0 V. Therefore, the scope of the present invention is not limited to a graph of FIG. 4 and therefore, a circuit shown in FIGS. 1 to 3 may be modified and implemented so as to normally generate the output signal H0 for the reference voltage VS having various values and ranges.

Figure 5:
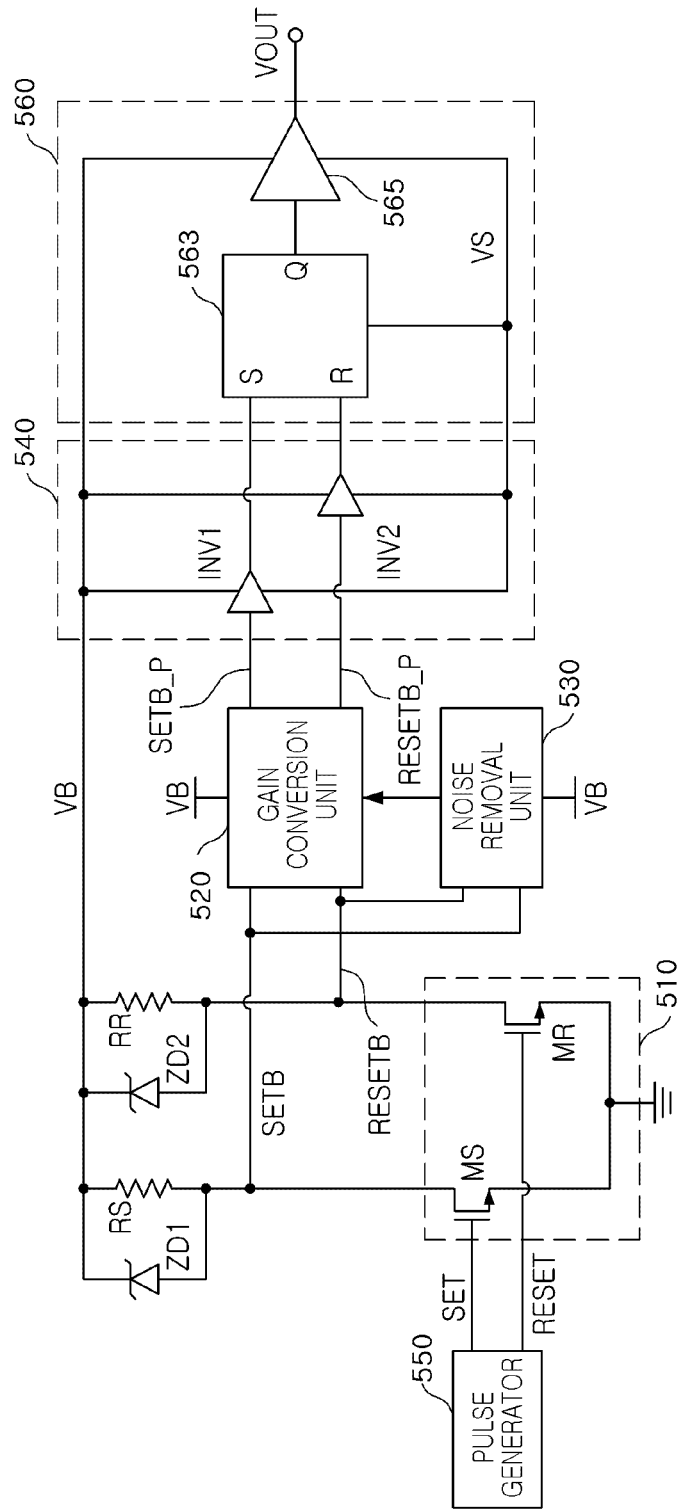
FIG. 5 is a circuit diagram illustrating a high side gate driver circuit including the level shifter circuit according to the embodiment of the present invention.

FIG. 5 is a circuit diagram illustrating the high side gate driver circuit including the level shifter circuit according to the embodiment of the present invention.

Referring to FIG. 5, the plurality of signals SET and RESET generated from a pulse generator 550 are input to gate terminals of the plurality of transistors MS and MR, respectively. The drain terminals of transistor MS and MR are respectively connected to the voltage VB through the resistors RS and RR and when each of the transistors MS and MR is turned-on, the voltage drop through the resistors RS and RR occurs. The plurality of signals SETB and RESETB generated due to the voltage drop are input to a gain conversion unit 520 and a noise removal unit 530, and the gain conversion unit 520 outputs signals SETB_P and RESETB_P for operating a plurality of inverters INV1 and INV2, respectively. The operation of the gain conversion unit 520 and the noise removal unit 530 is as described with reference to FIGS. 2 and 3, and the filter circuit may be additionally provided between an output terminal of the gain conversion unit 520 and input terminals of the inverters INV1 and INV2.

Output signals of the plurality of inverters INV1 and INV2 are applied to an S-R latch 563 and an output signal of the S-R latch 563 is input to the gate driver 565. An output signal VOUT of the gate driver 565 may be connected to a gate terminal of the high voltage output device, and the like.

As set forth above, the level shifter circuit may be stably operated even when the potential of the reference voltage of the high side gate driver circuit drops to have the negative (−) potential and the malfunctioning thereof may be prevented by excluding the effect of the voltage drop appearing when the sudden fluctuation in voltage occurs.

While the present invention has been shown and described in connection with the embodiments, it will be apparent to those skilled in the art that modifications and variations can be made without departing from the spirit and scope of the invention as defined by the appended claims.

What is claimed is:

1. A level shifter circuit, comprising:
a plurality of switching devices connected to a predetermined DC power supply through a resistor and operated by different driving signals;
a gain conversion unit operated by first signals output from the plurality of switching devices, respectively, and generating second signals having a level within a predetermined range of the first signals; and
a noise removal unit connected to at least one output terminal among the plurality of switching devices to prevent malfunctioning of the gain conversion unit,
the gain conversion unit inputting the second signals to a high side gate driver circuit through an inverter circuit,
wherein:
the plurality of switching devices include a first switching device and a second switching device that are operated by different driving signals to generate different output signals,
the gain conversion unit includes a third switching device connected to an output terminal of the first switching device,
the noise removal unit includes a fourth switching device connected to an output terminal of the second switching device, and
the gain conversion unit includes a current mirror circuit that is controlled by a turning-on and turning-off operation of the third switching device.

2. The level shifter circuit of claim 1, wherein the current mirror circuit has a current mirror ratio set so that current flowing in the fourth switching device is higher than that flowing in an output terminal of the current mirror circuit.

3. The level shifter circuit of claim 1, wherein the gain conversion unit generates the second signals having a signal level in a range different from the first signals.

4. The level shifter circuit of claim 1, further comprising a filter circuit connected between an output terminal of the gain conversion unit and an input terminal of the inverter to filter a signal having a pulse width smaller than that of the driving signal.

5. The level shifter circuit of claim 1, wherein the plurality of switching devices, the gain conversion unit, and the noise removal unit are included in a single integrated circuit (IC).

6. A gate driver circuit including the level shifter circuit of claim 1.

7. A level shifter circuit, comprising:
a first transistor and a second transistor controlled so as to be turned-on and turned-off by a first pulse signal and a second pulse signal having different phases;
a first resistor and a second resistor respectively connected between drain terminals of the first transistor and the second transistor and a predetermined DC power supply;
a third transistor connected to the drain terminal of the first transistor;
a fourth transistor connected to the drain terminal of the second transistor; and
a first current mirror circuit having an input terminal connected to a drain terminal of the third transistor and an output terminal connected to a drain terminal of the fourth transistor,
the fourth transistor preventing output fluctuations in the first current mirror circuit due to a voltage drop occurring in at least one of the first resistor and the second resistor by a change in the DC power supply.

8. The level shifter circuit of claim 7, further comprising:
a fifth transistor connected to the drain terminal of the second transistor;
a sixth transistor connected to the drain terminal of the first transistor; and
a second current mirror circuit having an input terminal connected to a drain terminal of the fifth transistor and an output terminal connected to a drain terminal of the sixth transistor,
wherein the sixth transistor prevents output fluctuations in the second current mirror circuit due to a voltage drop occurring in at least one of the first resistor and the second resistor due to the change in the DC power supply.

9. The level shifter circuit of claim 8, wherein the first current mirror circuit generates a first output signal by processing the first pulse signal as an input signal, and
the second current mirror circuit generates a second output signal by processing the second pulse signal as an input signal.

10. The level shifter circuit of claim 7, further comprising an inverter circuit connected to the output terminal of the first current mirror circuit to transfer an output signal of the current mirror circuit to a high side logic circuit.

11. The level shifter circuit of claim 10, further comprising a filter circuit connected to the output terminal of the first current mirror circuit to filter noise due to a pulse signal having a width smaller than a pulse width of the first pulse signal and the second pulse signal.

12. The level shifter circuit of claim 7, wherein the first current mirror circuit has a current mirror ratio set so that current flowing in the fourth transistor is higher than that flowing in the output terminal of the first current mirror circuit.

13. The level shifter circuit of claim 7, wherein the first to fourth transistors, the first and second resistors, and the first current mirror circuit are included in a single integrated circuit (IC).

14. A gate driver circuit including the level shifter circuit of claim 7.

* * * * *